(12) United States Patent
Orchard-Webb

(10) Patent No.: US 6,414,831 B1
(45) Date of Patent: Jul. 2, 2002

(54) LOW LEAKAGE ELECTROSTATIC DISCHARGE PROTECTION SYSTEM

(75) Inventor: Jonathan Harry Orchard-Webb, Wales (GB)

(73) Assignee: Mitel Corporation, Kanata (CA)

( * ) Notice: Subject to any disclaimer, the term of this patent is extended or adjusted under 35 U.S.C. 154(b) by 0 days.

(21) Appl. No.: 09/246,842

(22) Filed: Feb. 9, 1999

(30) Foreign Application Priority Data

Feb. 21, 1998 (GB) .............................................. 9803583

(51) Int. Cl.⁷ ................................................. H02H 9/00
(52) U.S. Cl. ......................... 361/111; 361/56; 257/355
(58) Field of Search ........................... 361/54, 56, 111; 327/309, 310; 257/355, 356, 367

(56) References Cited

U.S. PATENT DOCUMENTS

| 3,611,065 A | * | 10/1971 | Zschauer et al. ............ 257/717 |
| 3,909,119 A | * | 9/1975 | Wolley |
| 4,536,469 A | * | 8/1985 | Adlerstein ................... 430/314 |
| 4,590,664 A | * | 5/1986 | Prentice et al. ................ 29/571 |
| 4,736,271 A | * | 4/1988 | Mack et al. .................... 361/91 |
| 4,924,286 A | * | 5/1990 | Ishibashi ...................... 357/46 |
| 5,014,243 A | * | 5/1991 | Takada .......................... 365/96 |
| 5,189,588 A | * | 2/1993 | Yano et al. .................... 361/56 |
| 5,440,162 A |   | 8/1995 | Worley et al. |
| 5,515,225 A |   | 5/1996 | Gens et al. |
| 5,610,790 A | * | 3/1997 | Staab et al. .................... 361/56 |
| 5,696,398 A |   | 12/1997 | Yamamoto |
| 5,907,181 A | * | 5/1999 | Han et al. .................... 257/630 |
| 5,994,738 A | * | 11/1999 | Wollesen ..................... 257/347 |

FOREIGN PATENT DOCUMENTS

| EP | 0296675 | 2/1988 |
| EP | 606667 A | 7/1994 |
| GB | 2286289 A | 9/1995 |
| WO | WO 96/22613 A | 7/1996 |

* cited by examiner

Primary Examiner—Josie Ballato
Assistant Examiner—Kim Huynh
(74) Attorney, Agent, or Firm—Lawrence E. Laubscher, Jr.

(57) ABSTRACT

A protection system employing high voltage input diodes and low voltage supply clamp to prevent input diode leakage increasing due to reverse stress during electrostatic discharge events.

10 Claims, 6 Drawing Sheets

LOW LEAKAGE ELECTROSTATIC DISCHARGE PROTECTION SYSTEM

FIELD OF THE INVENTION

The present invention relates to an electrostatic discharge protection (ESD) circuit suitable for use in integrated circuits and more particularly, the present invention relates to a protection circuit employing high reverse breakdown voltage diodes for ensuring that no avalanche and consequent leakage occurs at input pads.

BACKGROUND OF THE INVENTION

As is well known in the semiconductor art, electrostatic discharge can deleteriously affect the circuit components or in some cases even destroy the circuit entirely. Electrostatic charges can readily accumulate on the human body or can be generated by machines in production processes or friction during transport. There is a strong tendency for integrated circuit p/n junctions to show greatly increased leakage when subjected to reverse stress. Since p/n junctions are commonly used for the protection of integrated circuits against ESD events, this increased leakage is a serious problem where low leakage is necessary.

Further, it is established that the leakage current in protection diodes increases by several orders of magnitude after being subjected to ESD.

To contend with this problem, the use of chip diodes has had widespread application to protect circuits.

Advantageously, the present invention alleviates the complications and limitations in previously proposed solutions and contributes the following:

i) a protection circuit that avoids reverse breakdown at inputs;

ii) diodes distributed across power supply rails; and iii) a low resistance return loop through the substrate and power rails.

The present invention provides a solution to this leakage problem at inputs by ensuring that no diode attached to an input can sustain a voltage close to that required for reverse breakdown.

SUMMARY OF THE INVENTION

According to one object of one embodiment of the present invention, there is provided an electrostatic discharge protection circuit suitable for use with an integrated circuit. The electrostatic discharge protection circuit includes a first high voltage p/n junction diode connected between a positive supply of the circuit and a first input and a second high voltage p/n junction diode connected between a negative supply of the circuit and the input. The first diode and the second diode each comprise a field plated diode for increasing reverse breakdown voltage of the diodes. A third diode is connected between the positive supply and the negative supply for conducting in two directions at low voltage. The third diode has a reverse breakdown voltage exceeding the voltage of the supply.

In accordance with a further object of one embodiment of the present invention, there is provided a method of preventing input diode leakage in a circuit with a positive supply and a negative supply from reverse stress during ESD events.

A first high voltage diode and a second high voltage diode are provided and the first diode is connected between the positive supply and an input of the circuit. The second diode is connected between the negative supply and the input and a third diode is connected between the positive supply and the negative supply. The third diode conducts in two directions and has a reverse breakdown voltage third diode for conducting in two directions and having a reverse breakdown voltage exceeding the voltage of the first supply and the second supply to substantially prevent diode leakage during ESD events.

Successful results have been achieved by modifying the input diodes to increase the breakdown voltage for avoiding over stressing of the input diodes. In the examples, field plating is used for field relief on the input diodes. Alternatively, special diffusion, i.e. p-base may be used to increase the breakdown voltage. By making use of field plating in the protection circuits, a new failure mechanism is provided. The use of field plates has been proposed in the art previously to increase breakdown voltage and accordingly this is not a new concept. The instant invention relates to the use of field plating in protection circuits used as a new failure mechanism as indicated above.

Having thus generally described the invention, reference will now be made to the accompanying drawings illustrating preferred embodiments.

BRIEF DESCRIPTION OF THE DRAWINGS

Similar numerals used in the text denote similar elements.

DETAILED DESCRIPTION OF THE PREFERRED EMBODIMENTS

Figure 1:
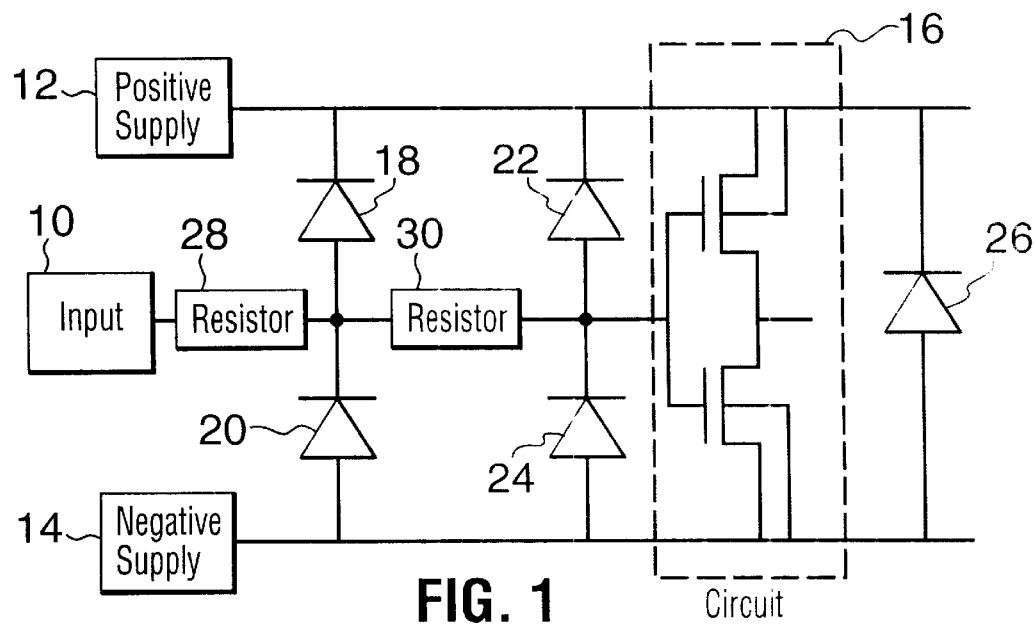
FIG. 1 is a schematic illustration of a generalized diode protection circuit.

Referring now to the drawings, FIG. 1 illustrates a first example of the input protection circuit according to one embodiment of the present invention. In the example, an input 10 is positioned between a positive supply 12 and a negative supply 14. The circuit, shown in dashed lines, to be protected is generically referenced by numeral 16. A diode network extends between supplies 12 and 14 which includes diodes 18, 20, 22, and 24. A further diode 26 may be provided and also may represent an array of additional diode network(s). Diode 26 is a fundamental element to the operation of the system described herein. This element may also comprise a circuit network capable of conducting in both directions during an ESD event. Resistors 28 and 30 are provided between input 10 and resistors 18 and 20 and between resistors 22, 24 and 18, 20, respectively.

Figure 2:
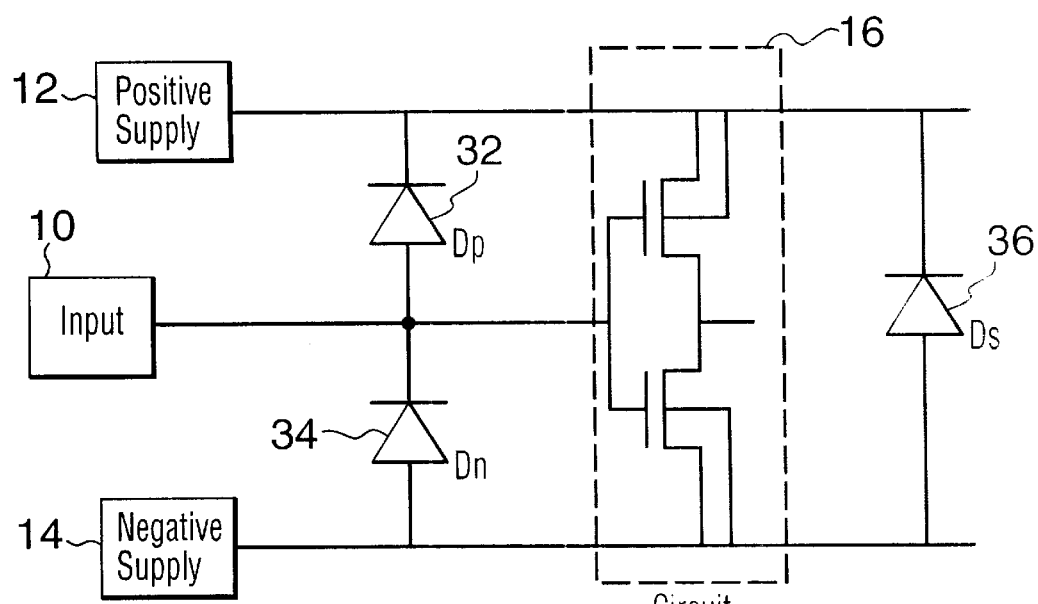
FIG. 2 is a schematic illustration of a diode protection circuit according to a further embodiment of the present invention.

With respect to FIG. 2, shown is an example of an input protection arrangement in accordance with the present invention. In this embodiment, the resistors and diodes of FIG. 1 are removed and replaced by diodes 32 and 34 extending between supplies 12 and 14. Diodes 32 and 34 each comprise high voltage p/n junction diodes. Further diodes are represented by numeral 36 and are desirably fast acting diodes. An example is a npn diode with snap back action under reverse bias.

The protection system needs to be functional to protect against electrostatic discharges through all external connections to the circuit. In operation, the protection system, with a negative input, diode 34 forward biases and conducts the current back to the negative input 14. This is exemplary only as many further possibilities will be appreciated.

Figure 3:
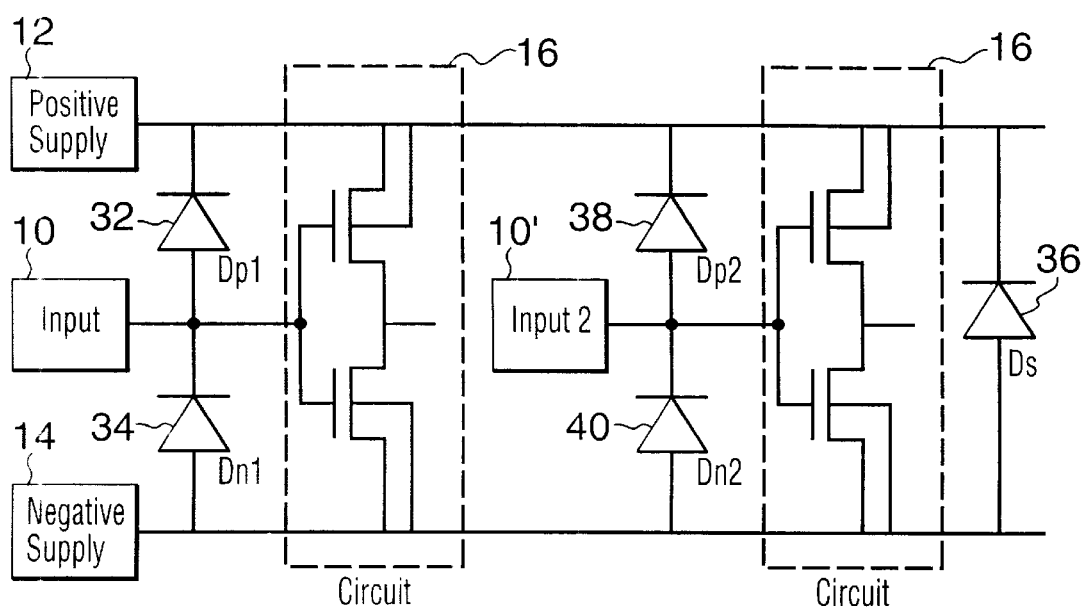
FIG. 3 is a schematic illustration of a diode protection circuit similar to FIG. 2 with a pair of the protection circuits shown.

FIG. 3 schematically illustrates an important protection circuit for electrostatic discharge between two input pads 10 and 10'. An additional array of diodes 38 and 40 are included for input 10'. In a situation where there was discharge between inputs 10 and 10' with a positive charge on input 10, diode 32 would forward bias to positive supply 12 and diode 36 would breakdown to the negative input 14; this would allow the circuit to be completed through the forward biased diode 40. Diode 34 operates to withhold the reverse voltage of diode 36, two forward diode voltage drops and the ohmic loop voltage drops. There is a requirement to augment the reverse breakdown voltage of the input diodes to reduce the possibility of damage caused by avalanche breakdown or near avalanche stress.

In the instance where the electrostatic polarity is reversed, the conduction path follows diodes 38, 36 and 34.

Figure 4:
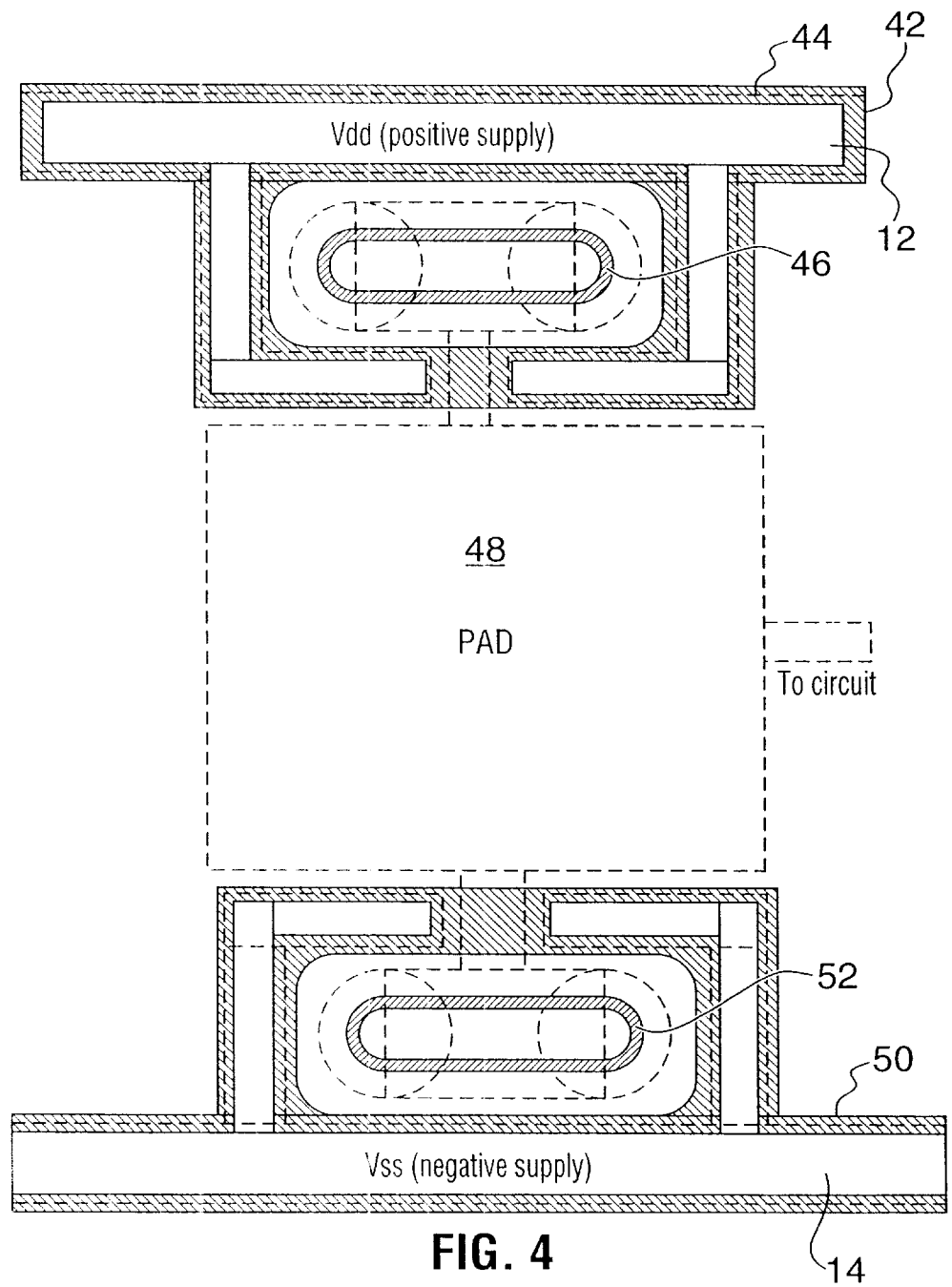
FIG. 4 is a schematic representation of a circuit for network implementation in a first embodiment.

A possible implementation of the circuit of FIG. 3 is illustrated schematically in FIG. 4. In this embodiment field plated diodes are employed. Field plating the diodes has been found to be particularly useful in the prevention of breakdown of reverse voltage at inputs of the circuit. In the illustration, input 12 has N– well 42, N+ active 44, P+ active 46 integral therewith connected to pad 48. In a similar manner, input 14 includes P+ active layer 50, N+ active layer 52 integrally connected to pad 48. Pad 48 connects to the circuit.

Figure 5:
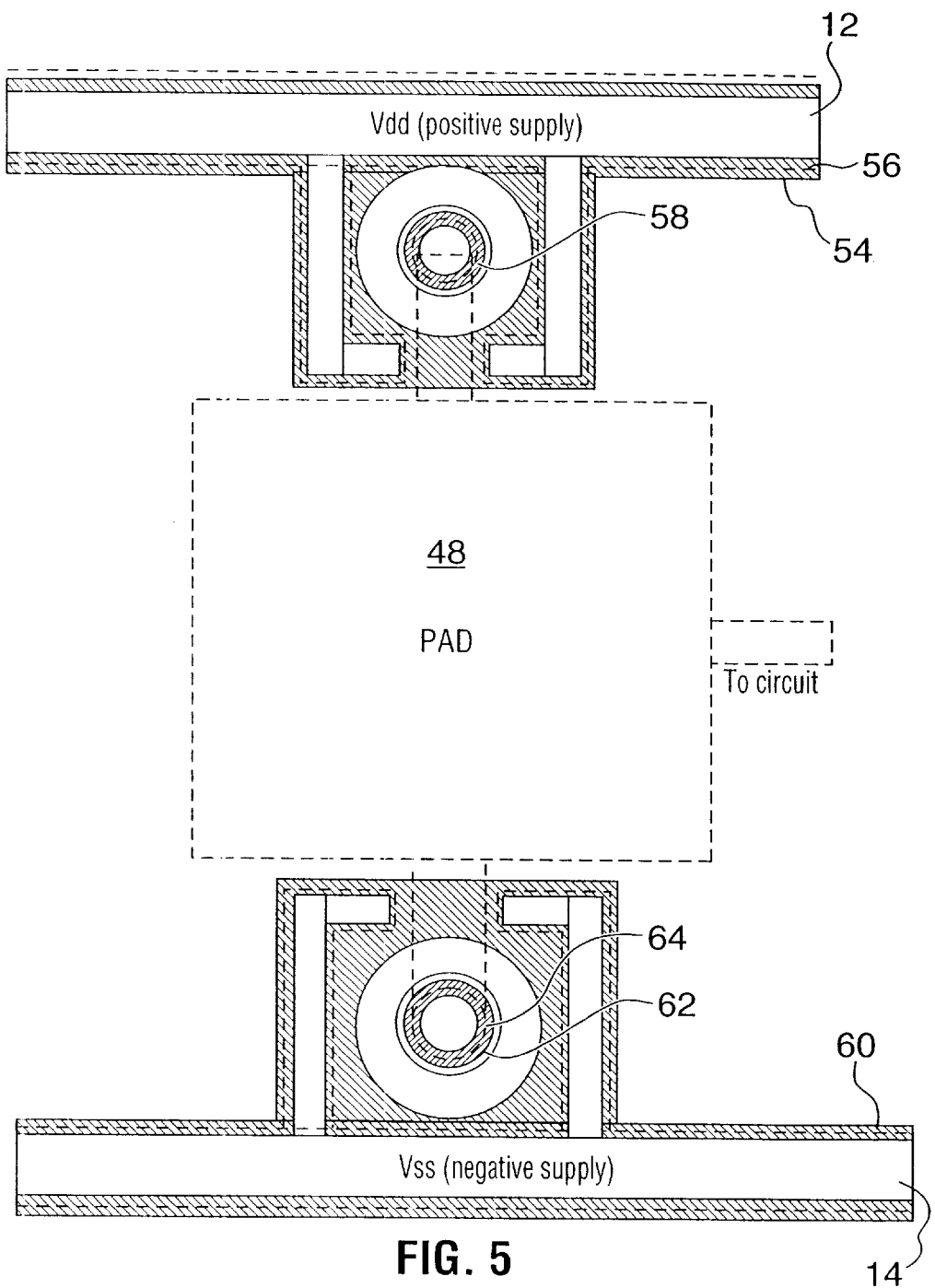
FIG. 5 is a schematic representation of a circuit for network implementation in a second embodiment.

FIG. 5 sets forth an example of a protection circuit with deep junction diodes. Input 12 has P well 54, N+ active 56 and P+ active 58 Input 14 has N+ active 60, P base 62 and N+ active 64. The use of an N well and another deep junction has utility for augmenting breakdown voltage. With respect to the input diodes, they comprise diffused n+/p– and p+/n– with field plating to increase the reverse breakdown voltage. It is also contemplated that Schottky diodes, simple avalanche diodes, mos transistors etc. may be used, provided that the reverse breakdown voltage can be made very much greater than that of diode 36.

Figure 6:
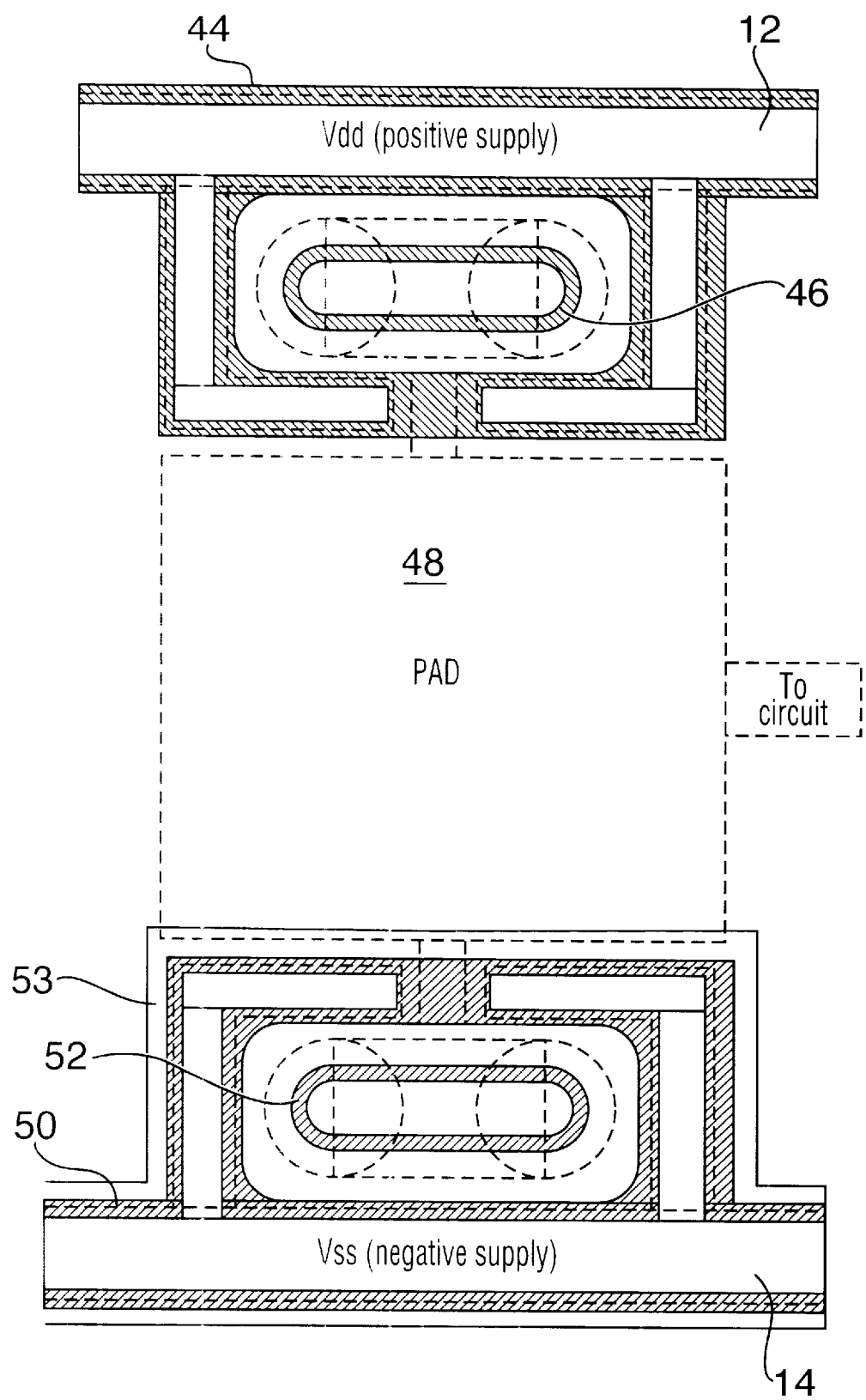
FIG. 6 is a schematic representation of a circuit for network implementation in a third embodiment.
Figure 7:
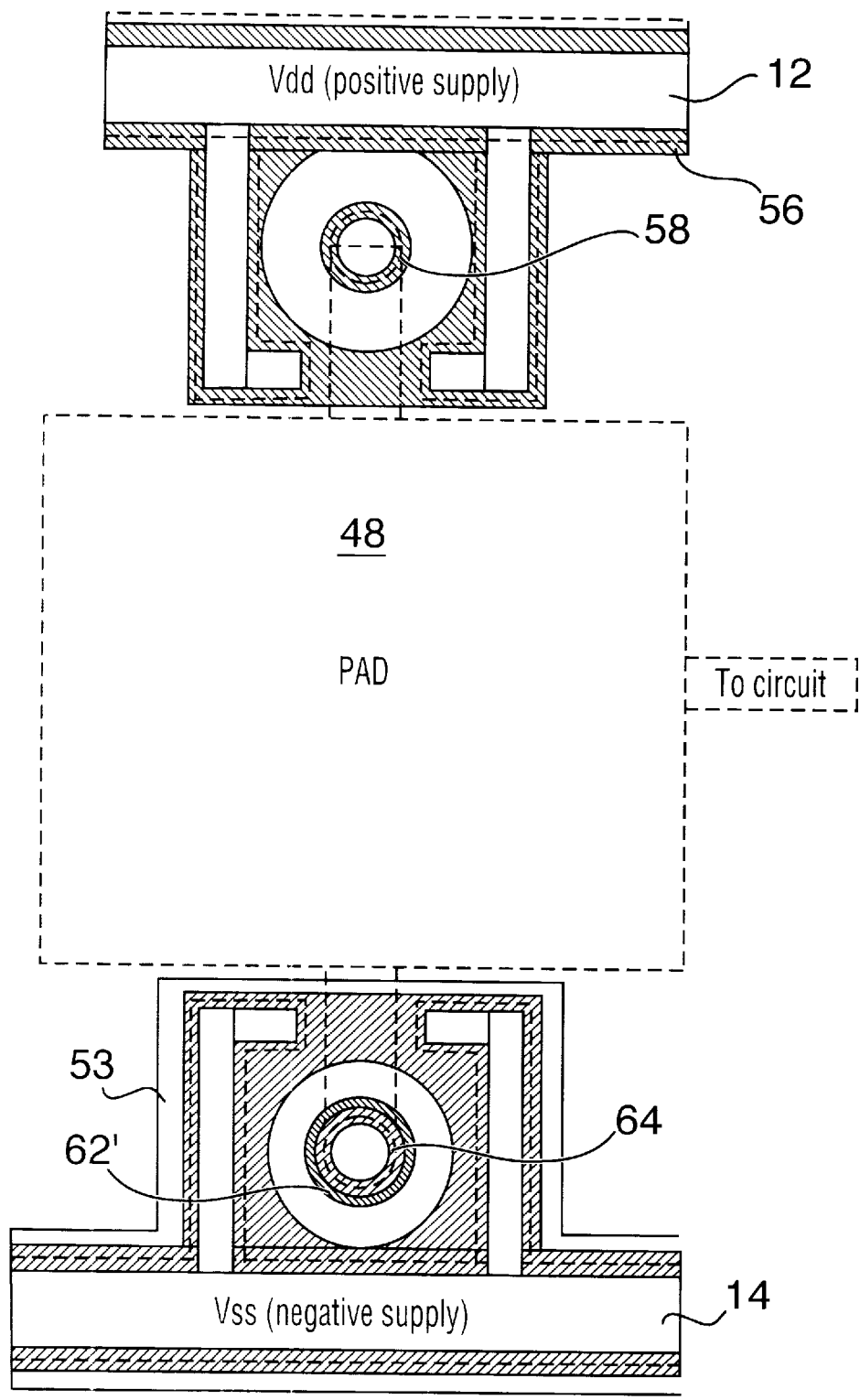
FIG. 7 is a schematic representation of a circuit for network implementation in a fourth embodiment.

Referring now to FIGS. 6 and 7, shown is a further embodiment where the arrangement provides an N base 62' with the output at 14 having a P-well 53. Similar numerals denote similar elements.

In summary, FIGS. 4 and 5 illustrate a P substrate process, whereas FIGS 6 and 7 depict an N substrate process.

In further embodiments, the invention is applicable to any input for which the leakage has to be low and not susceptible to failure in overstress conditions. The circuit may be applied to any integrated circuit or circuit that employs a semiconductor. Input leakage also causes increases in the noise generated by the input diodes and accordingly, the protection circuit herein may be useful in circuits where the input noise has to be maintained at low levels even after exposure to ESD events.

Although embodiments of the invention have been described above, it is not limited thereto and it will be apparent to those skilled in the art that numerous modifications form part of the present invention insofar as they do not depart from the spirit, nature and scope of the claimed and described invention.

I claim:

1. An electrostatic discharge protection circuit suitable for low leakage protection in a CMOS integrated circuit, comprising:

a first high voltage field plated p/n junction diode connected between a positive supply of said circuit and a first input for increasing reverse breakdown voltage of said diode;

a second high voltage field plated p/n junction diode connected between a negative supply of said circuit and said input for increasing reverse breakdown voltage of said diode; and a third diode connected between said positive supply and said negative supply and having a reverse breakdown voltage exceeding the voltage between said positive supply and said negative supply.

2. The protection circuit as set forth in claim 1, wherein said third diode comprises an npn diode.

3. The protection circuit as set forth in claim 2, wherein said third diode comprises a lateral npn snap back diode.

4. The protection circuit as set forth in claim 1, wherein each diode is a forward bias diode.

5. The protection circuit as set forth in claim 1, wherein said second diode comprises a p-well into an n-substrate.

6. The protection circuit as set forth in claim 1, wherein said first diode comprises an n-well into a p-substrate.

7. The protection circuit as set forth in claim 1, wherein each said diode comprises a Schottky diode.

8. The protection circuit as set forth in claim 1, wherein said third diode comprises a p/n junction diode.

9. The protection circuit as set forth in claim 8, wherein said third diode comprises a high voltage diode.

10. A method of preventing input diode leakage in a CMOS integrated circuit with a positive supply and a negative supply from reverse stress during ESD events, comprising:

providing a first high voltage field plated diode and a second high voltage field plated diode;

connecting said first diode between said positive supply and an input of said circuit;

connecting a third diode between said positive supply and said negative supply, and having a reverse breakdown voltage exceeding the voltage of said first supply and said second supply to substantially prevent diode leakage during ESD events.

* * * * *